(12) United States Patent
Goeppner

(10) Patent No.: US 10,141,903 B2
(45) Date of Patent: Nov. 27, 2018

(54) METHODS AND SYSTEMS FOR CONTROLLING AUDIO OUTPUT OF AN EXTERIOR VEHICLE AUDIO SYSTEM

(71) Applicant: Andrew T. Goeppner, Dublin, OH (US)

(72) Inventor: Andrew T. Goeppner, Dublin, OH (US)

(73) Assignee: Honda Motor Co., Ltd., Tokyo (JP)

( * ) Notice: Subject to any disclaimer, the term of this patent is extended or adjusted under 35 U.S.C. 154(b) by 250 days.

(21) Appl. No.: 15/058,517

(22) Filed: Mar. 2, 2016

(65) Prior Publication Data

US 2017/0257071 A1    Sep. 7, 2017

(51) Int. Cl.
*H03G 3/20* (2006.01)
*G06F 3/16* (2006.01)

(52) U.S. Cl.
CPC .............. *H03G 3/20* (2013.01); *G06F 3/165* (2013.01); *H04R 2499/13* (2013.01)

(58) Field of Classification Search
CPC ........ H03G 3/20; G06F 3/165; H04R 2499/13
USPC ........................................ 381/391, 345, 398
See application file for complete search history.

(56) References Cited

U.S. PATENT DOCUMENTS

| | | | | |
|---|---|---|---|---|
| 4,558,460 | A * | 12/1985 | Tanaka | B62J 99/00 381/57 |
| 5,046,981 | A * | 9/1991 | Roddy | A63H 5/00 369/30.02 |
| 6,173,513 | B1 * | 1/2001 | Akimoto | E02F 9/2228 37/414 |
| 7,394,906 | B2 | 7/2008 | Jun | |
| 7,583,807 | B2 * | 9/2009 | Enomoto | H03G 3/32 200/19.07 |
| 7,715,574 | B2 | 5/2010 | Aikins | |
| 8,121,307 | B2 * | 2/2012 | Yamaguchi | H03G 3/32 381/104 |
| 8,155,344 | B2 * | 4/2012 | Iimori | B60R 11/0217 381/86 |
| 9,036,828 | B2 | 5/2015 | Schambeck | |
| 2005/0157885 | A1 | 7/2005 | Olney et al. | |
| 2005/0232439 | A1 * | 10/2005 | Enomoto | H03G 3/32 381/86 |
| 2008/0112577 | A1 | 5/2008 | Crew | |

(Continued)

FOREIGN PATENT DOCUMENTS

| | | | |
|---|---|---|---|
| JP | 2002019533 | A | 1/2002 |
| JP | 2010089617 | A | 1/2010 |

(Continued)

*Primary Examiner* — Oyesola C Ojo
(74) *Attorney, Agent, or Firm* — Armstrong Teasdale LLP

(57) ABSTRACT

An audio system for a vehicle is described. The audio system includes an audio control computer device and an exterior audio assembly. The audio control computer device is in communication with a memory device. The audio control computer device is configured to store, in the memory device, at least one limited volume level and a corresponding speed range, receive a speed-related parameter indicative of an actual speed of the vehicle from a vehicle control system, determine if the actual speed of the vehicle is within the stored speed range based on the speed-related parameter, and permit operation of the exterior audio assembly at the at least one limited volume level when the actual speed of the vehicle is within the speed range.

18 Claims, 3 Drawing Sheets

(56) References Cited

U.S. PATENT DOCUMENTS

| | | | |
|---|---|---|---|
| 2009/0066499 A1 | 3/2009 | Bai et al. | |
| 2009/0080673 A1 | 3/2009 | Laurent | |
| 2012/0126969 A1* | 5/2012 | Wilbur | B60Q 1/506 |
| | | | 340/466 |
| 2013/0070082 A1* | 3/2013 | Chen | H04N 21/41422 |
| | | | 348/118 |
| 2016/0062626 A1* | 3/2016 | Kubota | G06F 3/0488 |
| | | | 715/716 |

FOREIGN PATENT DOCUMENTS

| | | |
|---|---|---|
| KR | 20050123295 A | 12/2005 |
| WO | 2007032389 A1 | 3/2007 |

\* cited by examiner

METHODS AND SYSTEMS FOR CONTROLLING AUDIO OUTPUT OF AN EXTERIOR VEHICLE AUDIO SYSTEM

BACKGROUND

The present disclosure relates generally to vehicle audio systems and more specifically, to methods and systems for controlling audio output of an exterior vehicle audio system.

At least some known vehicles include audio systems for listening to music or other audio output. Known audio systems include speakers mounted in the interior cabin of the vehicle. When a vehicle operator is outside of the vehicle, such as tail-gating, working around the vehicle (e.g., doing yard work), camping, washing the vehicle, and the like, the audio options for the vehicle operator are limited. For example, the operator must either use portable speakers operated from a different source or must listen to the audio output over the in-cabin audio system with the windows down. However, with at least some known systems, the audio quality is limited in such situations because the speakers are directed into the interior of the vehicle, thus making it difficult to hear the audio output external to the vehicle. Additionally, in some situations, the operator may be unable to have the windows down or doors open, such as when washing the vehicle or working around the vehicle where the operator does not want water or debris inside the vehicle.

As such, a need exists for methods and systems for controlling audio output externally to the vehicle without compromising the vehicle owner's experience.

BRIEF DESCRIPTION

In one aspect, an audio system for a vehicle is described. The audio system includes an audio control computer device and an exterior audio assembly. The audio control computer device is in communication with a memory device. The audio control computer device is configured to store, in the memory device, at least one limited volume level and a corresponding speed range, receive a speed-related parameter indicative of an actual speed of the vehicle from a vehicle control system, determine if the actual speed of the vehicle is within the stored speed range based on the speed-related parameter, and permit operation of the exterior audio assembly at the at least one limited volume level when the actual speed of the vehicle is within the speed range.

In another aspect, a vehicle comprising an exterior audio assembly, a vehicle audio system, and a controller area network (CAN) bus is described. The vehicle audio system includes an audio control computer device. The audio control computer device is configured to store, in a memory device, at least one limited volume level and a corresponding speed range, receive a speed-related parameter indicative of an actual speed of the vehicle from a vehicle control system, determine if the actual speed of the vehicle is within the stored speed range based on the speed-related parameter, and permit operation of the exterior audio assembly at the at least one limited volume level when the actual speed of the vehicle is within the speed range.

In yet another aspect, a computer-based method for controlling a volume level for a vehicle audio system associated with a vehicle and in communication with an exterior audio assembly is described. The vehicle audio system includes an audio control computer device, the audio control computer device being in communication with a memory device. The method includes storing, in the memory device, at least one limited volume level and a corresponding speed range, receiving a speed-related parameter indicative of an actual speed of the vehicle from a vehicle control system, determining if the actual speed of the vehicle is within the stored speed range based on the speed-related parameter, and permitting operation of the exterior audio assembly at the at least one limited volume level when the actual speed of the vehicle is within the speed range.

DETAILED DESCRIPTION

Figure 1:
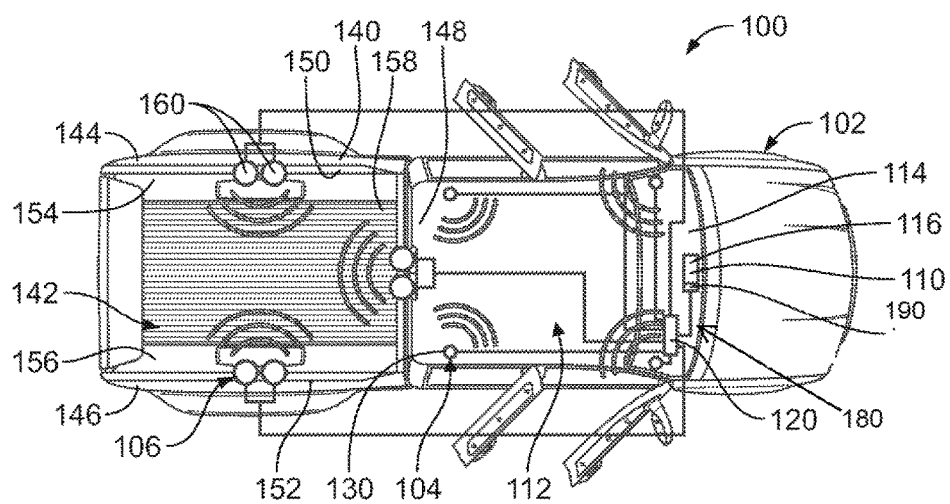
FIG. 1 is a schematic illustration of an exemplary vehicle audio system.

Various embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more functional blocks (e.g., systems, devices, processors, controllers, or memories) may be implemented in a single piece of hardware (e.g., a general purpose signal processor or random access memory, hard disk, or the like) or multiple pieces of hardware. Similarly, any programs may be stand-alone programs, may be incorporated as subroutines in an operating system, may be functions in an installed software package, and the like. It should be understood that the various embodiments are not limited to the arrangements and instrumentality shown in the drawings.

As used herein, the terms "module", "system," or "unit," may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. The modules, units, or systems shown in the attached figures may represent the hardware that operates based on software or hardwired instructions, the software that directs hardware to perform the operations, or a combination thereof.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments of methods and systems for controlling functions of a vehicle audio system are provided. It should be noted that although the various embodiments are described in connection with the automotive industry, such as, but not limited to, a truck, one or more embodiments may be implemented in different types of vehicles, in different industries and for different applications. Additionally, while embodiments described herein refer to a vehicle audio system that provides audio output externally to the vehicle, such as in a truck bed of the vehicle, the audio output may be provided at other areas of the vehicle in other various embodiments.

One or more embodiments include a system, which may be implemented as a programmable logic controller (PLC), also referred to as a programmable logic circuit that controls various functions and operations of the audio system of the vehicle, such as the audio input, the audio output, equalization of the audio output, such as to control frequency response of various speakers and/or transducers, such as to control bass, treble and the like, battery saving features, such as to turn off various electrical systems, and the like. The controller may control display functions on one or more display devices or screens.

In various embodiments, the system may include both interior audio assemblies (e.g., speakers mounted in a cabin of the vehicle) and exterior audio assemblies (e.g., speakers and/or transducers mounted external to the cabin of the vehicle to produce audio output externally to the vehicle cabin). The exterior audio assemblies provide a full range of audio output externally to the vehicle, such as for use when people are around the outside of the vehicle, such as, for example, during tailgating, while doing chores, while washing the vehicle and the like. The vehicle audio system described herein may be used to produce audio externally to the vehicle, and does not need to rely on speakers inside the vehicle cabin to produce the sound. As such, the windows or doors do not need to be open to listen to the audio system externally to the vehicle.

FIG. 1 is a schematic illustration of a vehicle audio system 100 for a vehicle 102. In the illustrated embodiment, the vehicle 102 is a truck. However, in other embodiments, other types of vehicles may be used. The vehicle audio system 100 includes at least one interior audio assembly 104 and at least one exterior audio assembly 106. Optionally, the vehicle audio system 100 may include only exterior audio assemblies 106. In one embodiment, the exterior audio assembly 106 is controlled with a threshold-based volume control system.

The vehicle audio system 100 includes a source unit 110 that produces an audio signal. In an exemplary embodiment, the source unit 110 is mounted within an interior of a cabin 112 of the vehicle 102. The source unit 110 may be any type of source unit, such as, for example, an automotive radio, an infotainment system of the vehicle 102, and/or any other suitable type of source unit. In one embodiment, the source unit 110 is a computer device that controls operation of digital audio outputs and includes an audio control (AC) computer device 190 that can be used to control volume output to exterior audio assembly 106. The source unit 110 has at least one input to produce an audio signal, such as a radio, a CD player, a satellite radio, a digital music player, and the like. In the example embodiment, source unit 110 is capable of controlling the volume of audio output of interior and exterior audio assemblies. Volume control for the interior audio assembly 104 may be facilitated using one or more volume control devices. Volume control devices may include buttons, knobs, dials, sliders, touch screen controls, and/or any volume control device operable to increase or decrease the audio volume for the interior audio assembly 104 and the exterior audio assembly 106.

As described above, the source unit 110 includes an audio control (AC) computer device 190. The AC computer device 190 may be a hardware device (e.g., a computer chip, a microcontroller, or the like) or it may be a software device (an application, a computer program, a computer-readable data file, or any set of instructions in high-level programming language, or in assembly language or in machine code, or the like). The AC computer device 190 is configured to cause the source unit to limit a volume level for the exterior audio assembly 106 and the interior audio assembly 104.

Optionally, the source unit 110 may be provided in a front dashboard 114 of the vehicle. The source unit 110 may include a display 116 and one or more user inputs 118, such as buttons, dials, touch pads, and the like. Optionally, the display 116 may be a touch screen including one or more of the user inputs 118. The source unit 110 may be connected to and/or include other systems of the vehicle 102 such as a navigation system, a vehicle monitoring system, a battery monitoring system, a satellite system, a phone system, and the like.

In the exemplary embodiment, the vehicle audio system 100 includes an amplifier 120 that receives the audio signal from the source unit 110. The amplifier 120 provides at least one output based on the audio signal. For example, the amplifier 120 may provide output to each interior audio assembly 104 and each exterior audio assembly 106. The amplifier 120 may be provided interior of the cabin 112. Optionally, the amplifier 120 may be part of the source unit 110. Optionally, the amplifier 120 may include one amplifier unit for the interior audio assembly 104 and a different amplifier unit for the exterior audio assembly 106. The amplifier units may be housed together within the same module or alternatively may be housed separately, such as in different locations in the vehicle 102.

The interior audio assemblies 104 each include an audio reproduction device, such as a speaker 130, mounted within the cabin 112 of the vehicle 102. The interior audio assemblies 104 are coupled to the amplifier 120 such that the interior audio assemblies 104 receive an output from the amplifier 120 to create audio output in the interior of the vehicle 102, such as within the cabin 112. The speakers 130 may be any type of speakers, such as standard automotive speakers and may be mounted anywhere within the cabin 112, such as within the dashboard of the vehicle 102, in the doors of the vehicle 102, or in any suitable location within the vehicle.

In the exemplary embodiment, the vehicle includes a communication area network (CAN) bus 180 communicatively coupled to various components and systems of the vehicle. The CAN bus 180 is a vehicle computer data bus implementing the CAN bus standard designed to enable microcontrollers and devices to communicate with each other in applications without a host computer. It is a message-based protocol, designed for multiplex electrical wiring within automobiles. For example, the CAN bus 180 may be connected to an engine control unit (ECU) that is used to control physical components within an automotive engine.

The vehicle 102 includes a plurality of body panels 140 that define various portions of the vehicle 102. For example, the body panels 140 may form a portion of any of the front end, the hood, the bumpers, the doors, the roof, the back end, the side panels, and/or the like. In an exemplary embodiment, the vehicle 102 is a truck and includes a truck bed 142. The truck bed 142 is defined by a driver side body panel 144, a passenger side body panel 146, and a head board body panel 148. A tailgate 149 may be provided opposite the head board body panel 148. The driver and passenger side body panels 144, 146 include wheel wells around the rear wheels of the vehicle 102. In an exemplary embodiment, the body panels 140 may be manufactured from composite materials and/or any other materials suitable for vehicle construction, such as metal. The body panels 140 may define exterior portions of the vehicle 102.

In an exemplary embodiment, the truck bed 142 includes a plurality of vehicle panels 150 defining the interior of the truck bed 142. The vehicle panels 150 may be fixed to corresponding body panels 140, which define the externally to the truck bed 142. For example, the vehicle panels 150 may be positioned between the storage space of the truck bed 142 and the corresponding body panels 140. The vehicle panels 150 may be manufactured from a resin composite material, a metal matrix material or any other material suitable for vehicle construction. For example, the vehicle panels 150 may be manufactured from a steel reinforced composite material. The vehicle panels 150 and/or body panels 140 may define bed rails 152 externally along the truck bed 142. For example, bed rails 152 may be provided along the side boards and head board of the truck bed 142.

In an exemplary embodiment, the vehicle panels 150 include a driver side bed panel 154, a passenger side bed panel 156, and a head board bed panel 158. Optionally, exterior audio assemblies 106 are associated with each of the bed panels 154, 156, 158. The exterior audio assemblies 106 direct audio output into the truck bed 142. The audio output is created and directed externally to the cabin 112 of the vehicle 102. In an exemplary embodiment, the exterior audio assemblies 106 use the vehicle panels 150 to create audio output. In an exemplary embodiment, the exterior audio assemblies 106 may provide a wide frequency range. For example, the exterior audio output is a full range of audio output. The exterior audio assemblies 106 may provide treble, mid-range and bass frequencies and/or any other frequency ranges therebetween. The full range of audio output may be from approximately 20 Hz to approximately 20 kHz, which is the approximate range of frequencies humans are able to hear; however the full range audio output may include a smaller subset of this frequency range. The full range audio output covers a sufficient frequency range for quality audio sound output, such as, but not limited to, music. "Full range" audio output may be defined as audio output in more than one recognized frequency range, such as treble and mid-range; mid-range and bass; treble and bass, and the like. Optionally, different exterior audio assemblies 106 may operate in different frequency ranges, which may or may not overlap.

In an exemplary embodiment, each exterior audio assembly 106 includes at least one transducer 160 mounted to the corresponding vehicle panel 150. Transducer 160 may also be referred to as an exciter. The exterior audio assemblies 106 are coupled to the amplifier 120 to receive an output from the amplifier 120 such that an audio output is created externally to the vehicle 102. For example, the audio output may be directed into the truck bed 142 and may propagate beyond the truck bed 142 to enable listening externally to the vehicle 102. The transducers 160 may be mounted to any portion of the vehicle panels 150 that enable the vehicle audio system 100 to function as described herein. The transducers 160 cause an excited region of the vehicle panel 150 to vibrate and create the full range of audio output externally to the vehicle 102. For example, the transducers 160 may be mounted to inner surfaces of the vehicle panels 150, such as between the vehicle panels 150 and the body panels 140. As such, the transducers 160 are protected from the harsh exterior environment of the truck bed 142.

Figure 2:
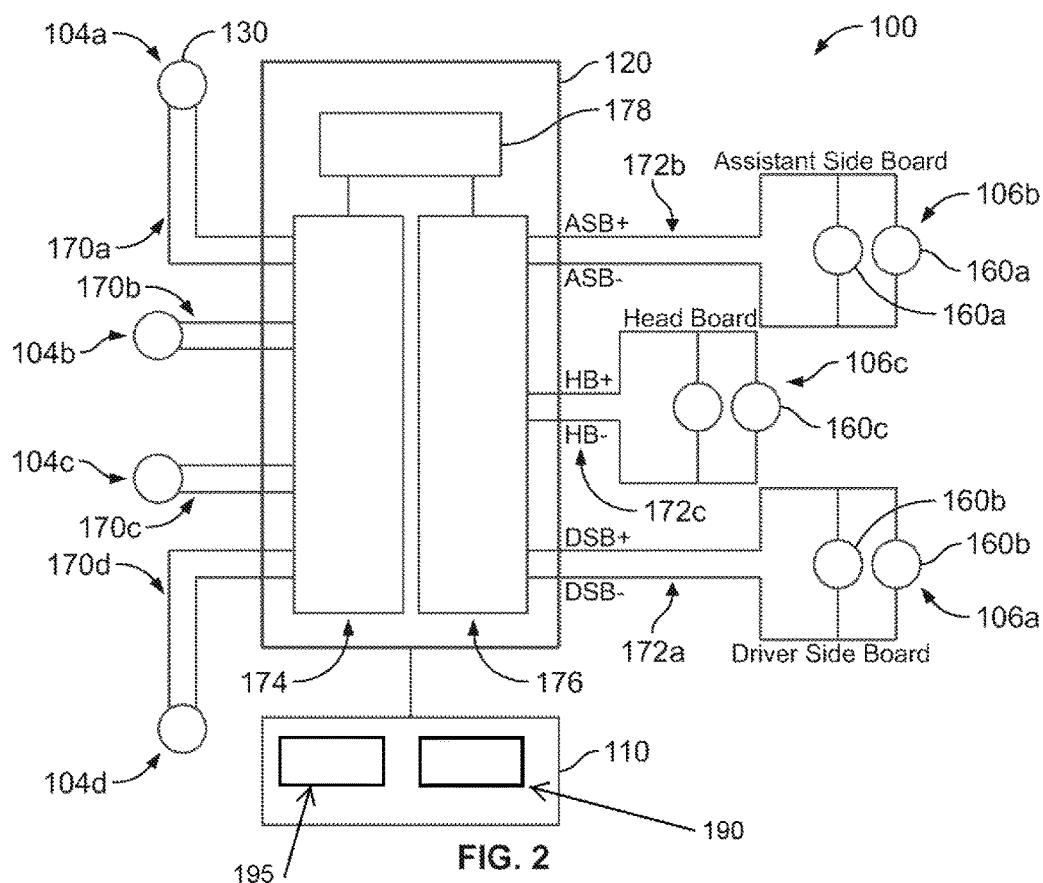
FIG. 2 is schematic illustration of the vehicle audio system shown in FIG. 1 including various exemplary interior audio assemblies and exterior audio assemblies.

FIG. 2 is a schematic illustration of the vehicle audio system 100 showing various interior audio assemblies 104 coupled to the amplifier 120 and various exterior audio assemblies 106 coupled to the amplifier 120. The source unit 110 includes an AC computer device 190 and a memory device 195 and provides a low power audio signal to the amplifier 120. In the illustrated embodiment, the amplifier 120 is configured to amplify the low power audio signal and to output higher power audio signals over a plurality of channels 170. Each interior audio assembly 104 (e.g., speaker 130a, 130b, 130c, 130d, etc.) is coupled to a corresponding channel 170a, 170b, 170c, 170d, etc. of the amplifier 120. Similarly, each exterior audio assembly 106a, 106b, 106c is coupled to a corresponding channel 172a, 172b, 172c of the amplifier 120. Each of the channels 170 has positive and negative terminals and corresponding conductors, such as wires, routed to the corresponding speakers 130 or transducers 160.

In an exemplary embodiment, the amplifier 120 includes an interior audio module 174 with the interior audio assemblies 104 coupled to the interior audio module 174 and an exterior audio module 176 with the exterior audio assemblies 106 coupled to the exterior audio module 176. Depending on the audio mode selected for the vehicle audio system 100, the amplifier 120 may power the interior audio module 174 and/or the exterior audio module 176. For example, when audio output is desired within the cabin 112, the interior audio module 174 is operated to power the interior audio assemblies 104. When exterior audio output is desired, the exterior audio module 176 is operated to power the exterior audio assemblies 106.

In an exemplary embodiment, each exterior audio assembly 106 includes a pair of transducers 160 electrically connected, such as connected in parallel or connected in series, with the positive and negative terminals of the corresponding channels 172. Any number of transducers 160 may be provided with each exterior audio assembly 106, including a single transducer 160 or multiple transducers 160. Each transducer 160 is operated to create audio output.

In an exemplary embodiment, each channel 172a, 172b, 172c may be independently controlled or tuned. For example, the transducers 160a associated with the driver side bed panel 154 may be tuned differently than the transducers 160b associated with the passenger side bed panel 156. The transducers 160c associated with the head board bed panel 158 may be tuned differently than the transducers 160a, 160b. Tuning of the transducers 160 may be performed by an equalizer 178 associated with the amplifier 120. The equalizer 178 may operate the various transducers 160 at different frequencies. For example, each channel 172a, 172b, 172c may be operated at a different frequency. The equalizer 178 controls the output of the channels 172 differently from each other. Optionally, the output of the amplifier 120 may be controlled by the equalizer 178 to achieve a desired sound quality target including, but not limited to, factors such as distortion, clarity and frequency response for each of the transducers 160. The equalizer 178 may control the output of the channels 172 based on various factors, such as the characteristics of the transducer 160, the mounting location of the transducer 160 to the vehicle panel 150, the shape and contour of the vehicle panel 150, the size of the vehicle panel 150, fixing locations of the vehicle panel 150 to the bed panel 140, and the like.

Figure 3:
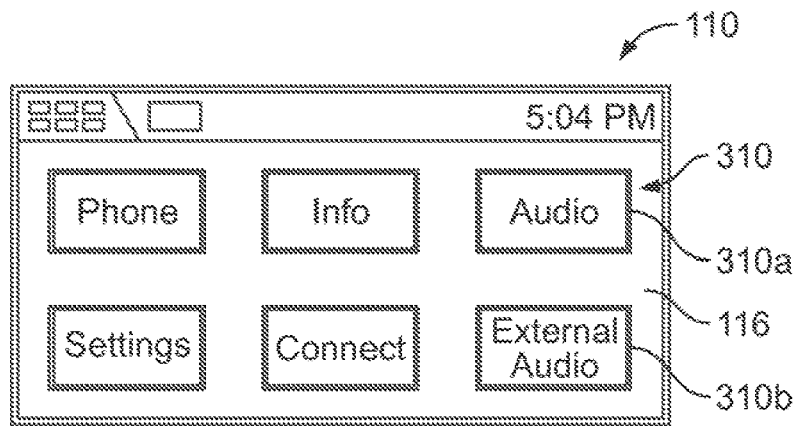
FIG. 3 illustrates a source unit of the vehicle audio system showing exemplary display icons on a display.

FIG. 3 illustrates the source unit 110 showing exemplary display icons 310 representing selectable function modes (or audio sources) and/or function controls of the vehicle audio system 100 on the display 116. The display 116 may display the virtual buttons or display icons 310, which may be touched by the user of the vehicle to control the vehicle audio system 100. For example, the display icons 310 may include an audio icon 310*a*, which may enable the user to change audio inputs or sources, such as from the AM/FM radio, a CD player, satellite radio, a digital music player, and the like.

The display icons 310 may include an external audio icon 310*b*, such as a truck bed audio icon, which may enable the user to access control options associated with the external audio system. Other icons may be displayed and they may be displayed in any arrangement that enables the vehicle audio system 100 to function as described herein.

The source unit 110 may be or include a computing device, and may include a memory, a transceiver, a processor and the like. The source unit may include an (audio control) AC computer device 190 as described above. In other embodiments, the source unit 110 may be the AC computer device 190, or operate in conjunction with the AC computer device 190. The processor may include one or more conventional electronic processors that interpret and execute instructions. The memory may include a random access memory (RAM), a read-only memory (ROM), and/or another type of dynamic or static storage device that stores information and instructions for execution by the processor. The RAM, or another type of dynamic storage device, may store instructions as well as temporary variables or other intermediate information used during execution of instructions by the processor. The ROM, or another type of static storage device, may store static information and instructions for the processor. The transceiver may communicate with the processor via a communication line, and may communicate wirelessly or via a wired connection with another device, such as a mobile phone, a cellular network, a satellite network, or other communication device. The source unit 110 may have a dedicated control module or unit configured to process the control inputs and/or to process the data to be displayed on the display 116 and to control the audio output.

The source unit 110 may have a home menu or main menu having display icons 210 corresponding to the various functions and sub-systems, including audio sub-systems. The user may activate control of one of the sub-systems, such as to control different audio inputs or sources, such as the AM/FM radio, a CD player, satellite radio, a digital music player, and the like.

Figure 4:
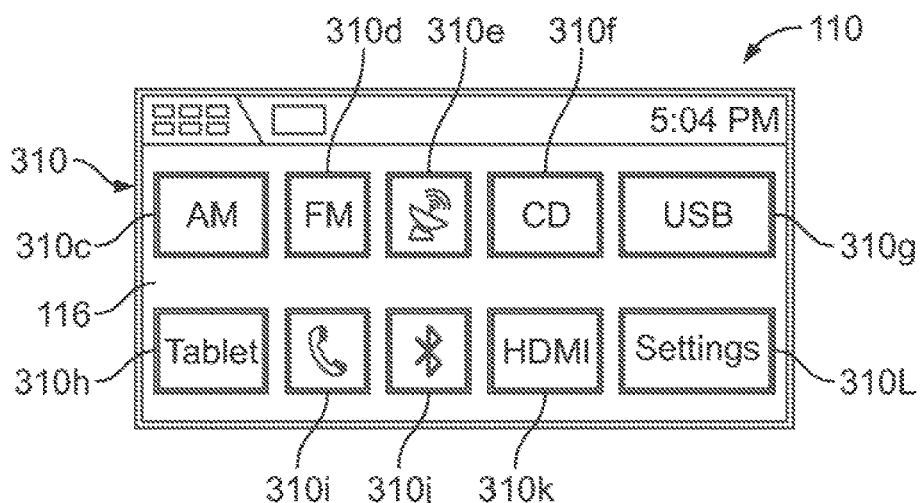
FIG. 4 illustrates the source unit showing additional exemplary display icons.

FIG. 4 illustrates the display 116 showing exemplary display icons 310 representing selectable function controls associated with the vehicle audio system 100. For example, the source unit 110 may have display icons 310 representing FM output 310*c*, AM output 310*d*, satellite radio output 310*e*, CD output 310*f*, auxiliary USB output 310*g*, iPod® output 310*h* (iPod is a registered trademark of Apple Inc. of Cupertino, Calif.), mobile device output 310*i*, Bluetooth® output 310*j*, auxiliary HDMI output 310*k*, settings 3101, and the like. Such arrangement of selectable control functions may represent an audio output menu that presents the user with the ability to access further controls of the audio system, such as station selection, song selection, volume control, tune control, seek control, scan control and the like via a new menu. Other types of icons may be presented in other embodiments, and such display icons may correspond to non-audio functions, such as climate control functions, or other vehicle sub-systems.

Figure 5:
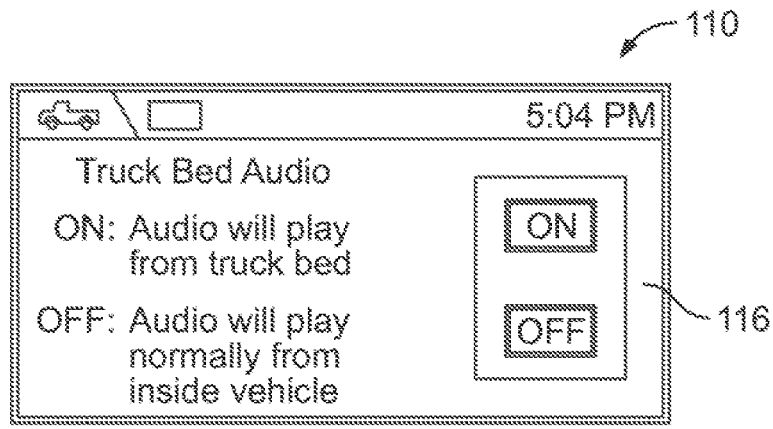
FIG. 5 illustrates the source unit showing an exemplary display.

FIG. 5 illustrates the source unit 110 showing an exemplary display after the external audio icon 310*b* (shown in FIG. 3) is selected. The source unit 110 may prompt the operator of the vehicle to control the external audio system by presenting an ON button 502 and an OFF button 504. Once the operator turns on the external audio system, the source unit 110 may control, or may cause one or more other controllers to control, other systems of the vehicle. For example, because the external audio system is typically operated when the operator is outside of the vehicle, internal systems may not be necessary. Optionally, the source unit 110 may shut off the internal audio system when the external audio system is operated. Optionally, the external audio system may not be operated unless the vehicle 102 is in park. For example, the user may not be able to select the external audio icon 310*b* unless the vehicle 102 is in park.

In other embodiments, the source unit 110 may restrict operation of the external audio system to when the vehicle 102 is stopped or is moving below a predefined speed, such as when the vehicle 102 is moved short distances to unload the contents of the truck bed at different locations. For example, the source unit 110 may deactivate or limit the volume for the external audio assembly 106 when the vehicle 102 is in motion.

In one such embodiment, the source unit 110 may be configured to control the volume of audio output by the external audio assembly 106 based on one or more speed-related parameters of the vehicle 102. The source unit 110 may have a subsidiary audio control (AC) computer device configured specifically to control volume levels for the exterior and interior audio assemblies. The source unit 110 continuously receives vehicle state data, including one or more speed-related parameters of the vehicle from a vehicle control system. The speed-related parameter is associated with a speed at which the vehicle is moving, and may include, for example and without limitation, the vehicle speed, the gear in which a transmission of the vehicle is operating, the revolutions per minute (or similar rotational rate) of the vehicle crankshaft, or the like. The speed input may be received via a Controller Area Network (CAN) bus. The source unit 110 is configured to compare the received speed-related parameter value to data stored in the memory 195. The data stored in the memory 195 may include, but is not limited to, a first speed-related parameter value corresponding to a vehicle speed of zero (i.e., vehicle not moving), a second speed-related parameter value corresponding to a first threshold vehicle speed, and a third speed-related parameter value corresponding to a second threshold vehicle speed that is higher than the first threshold vehicle speed.

In an exemplary embodiment, the source unit 110 may interpret the received speed-related parameter value and determine the vehicle speed. If the vehicle speed is zero, the source unit 110 is configured to enable unlimited control of the audio volume (e.g., the volume output of the external audio assembly 106 is not limited to a predefined maximum volume that is lower than the maximum volume the external audio assembly 106 is capable of producing). Moreover, the vehicle owner may use display icons 310 to control the audio volume for both the interior audio assembly 104 and at least one exterior audio assembly 106 (shown in FIG. 1). Although described herein as comparing a vehicle speed to stored threshold vehicle speeds, source unit 110 may compare any speed-related parameter to stored speed-related parameter value thresholds to determine when to limit the volume output by the exterior audio assembly 106.

If the vehicle speed is non-zero, the source unit 110 is configured to determine whether the speed is below the first threshold vehicle speed, such as 5 miles per hour. If the vehicle speed is greater than zero and less than the first threshold vehicle speed, the source unit 110 (using the AC computer device 190) is configured to generate a volume control command. The volume control command includes a limited volume level (e.g., 10% of maximum volume). The volume control command causes the source unit 110 to lower the volume of the audio being transmitted to the exterior audio assembly 106 to the limited volume level. In one embodiment, if the volume for the exterior audio assembly 106 was already zero (e.g., if the audio was off previously) the source unit 110 is configured to leave the volume level at zero or off for the exterior audio assembly 106. However, if the exterior audio was on and at, for example, 50%, the source unit 110 is configured to lower the volume level to the limited volume level. This embodiment enables the vehicle owner to move the vehicle at low speeds and still be able to hear the external audio. Additionally, this prevents the vehicle owner from causing a nuisance by driving the vehicle (e.g., through a residential neighborhood) with the audio playing at an unreasonably high level.

If the vehicle speed is non-zero and above the second threshold vehicle speed, the source unit 110 is configured to update the volume level for the exterior audio assembly 106 to be zero. For example, if the vehicle speed is 20 miles per hour, the source unit 110 is configured to terminate audio signal transmission to the exterior audio assembly 106. In other embodiments, the source unit 110 may continue audio signal transmission but limit the audio volume to be zero. In still other embodiments, the source unit 110 may both update the volume level to be zero and terminate audio transmission to the exterior audio assembly 106. In each above mentioned embodiment, audio transmission and volume control may be enabled for the interior audio assembly 104 so that the vehicle can still playback audio inside the vehicle. In this way, the described embodiments enable independent control of audio transmission and volume for the exterior audio assembly 106 and the interior audio assembly 104.

In order to avoid relatively rapid transitions between limited volume levels and non-limited volume levels, a time-based delay may be implemented. For example, if vehicle 102 accelerates from zero to five miles per hour (and five miles per hour is the first threshold vehicle speed), and continues at a speed that varies between four and six miles per hour, once the volume output of the exterior audio assembly 106 is limited due to reaching five miles per hour, the time-based delay prevents the volume from switching between limited and non-limited volume levels for a predefined length of time even if the vehicle speed is reduced below the threshold vehicle speed. Although described as a time-based delay, any other method of preventing rapid switching between limited and non-limited volume levels may be used that allows the vehicle audio system 100 to function as described herein.

When the engine is off, the source unit 110 may turn off unnecessary sub-systems or components of the vehicle 102, such as to conserve battery power. For example, the source unit 110 may turn off the display 116. Optionally, the display 116 may be automatically shut off after a predetermined time period, such as one minute. The source unit 110 may include a timer to control shutting off of one or more systems or components. The source unit 110 may cause lighting systems to shut off. The source unit 110 may cause climate control systems to shut off. The source unit 110 may cause other background electrical systems to turn off, such as systems connected by the vehicles controller area network (CAN), which may include, but is not limited to, the transmission system, the ABS system, the airbag system, or other systems.

In an exemplary embodiment, the source unit 110 itself, or another system, monitors the battery level or battery state of the battery of the vehicle. For example, the battery monitor may determine if a battery voltage is above a predefined threshold voltage level, which is at a level above which the battery needs to start the vehicle 102. When the battery state is at the threshold battery state, the source unit 110 may turn off the external audio system. Optionally, the source unit 110 may indicate to the user that the external audio system is about to be shut off. For example, an audible indicator may be transmitted through the external audio system. A visual indicator, such as a message on the display 116, may be provided indicating that the external audio system will be shut down, such as after 30 seconds unless the vehicle is restarted.

Figure 6:
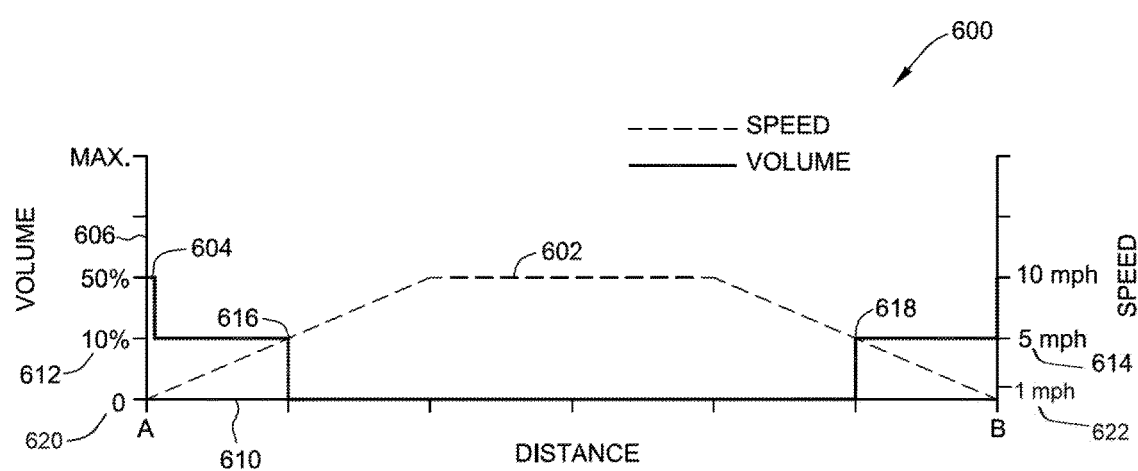
FIG. 6 shows a graph illustrating how an audio control (AC) computer device adjusts volume levels as the speed of a vehicle changes.

FIG. 6 shows a graph 600 illustrating how the AC computer device 190 adjusts volume levels as the speed of a vehicle changes. For illustrative purposes, graph 600 shows a graph of vehicle speed and exterior audio volume for the vehicle 102 as it is driven from point A to point B. Curve 602 represents the speed of vehicle 102. As described above, although referred to as representing the speed of the vehicle, curve 602 may also or alternatively represent other speed-related parameters of a vehicle, including, but not limited to, the gear in which a transmission of the vehicle is operating, the revolutions per minute (or similar rotational rate) of the vehicle crankshaft, or the like. Curve 604 represents volume level for exterior assembly 106 as vehicle 102 is driven from A to B. A unitless X-axis 610 represents the distance traveled. A y-axis 606 represents volume level, and a y-axis 608 represents vehicle speed. For illustrative purposes only, a first threshold vehicle speed 622 is shown as one mile per hour and a second threshold vehicle speed 614 is shown as five miles per hour. Similarly, and for illustrative purposes only, a first limited volume level 612 is shown as 10% of maximum volume and a second limited volume level 620 is shown as 0% of maximum volume.

In the example shown in FIG. 6, at point A, the speed 602 of vehicle 102 is zero and the volume level 604 is at 50% of maximum (i.e., the vehicle owner is listening to audio at 50% of maximum while stopped at point A). When the vehicle speed 602 is below the first threshold vehicle speed 622 the volume output of the exterior assembly 106 is not limited or maintained below a predefined level. As vehicle 102 accelerates, its speed 602 rises from zero and approaches the first threshold vehicle speed 622 of one mile per hour. It is also contemplated that the first threshold vehicle speed 622 may be any speed greater than zero miles per hour. When speed 602 exceeds the first threshold vehicle speed, the AC computer device 190 is configured to update the volume 604 for exterior audio assembly 106 from the current volume level to the first limited volume level 612 (i.e., 10% of maximum in this example). The volume level 604 remains at the first limited volume level 612 until the vehicle 102 accelerates past the second threshold vehicle speed 614 of five miles per hour. At point 616, the vehicle 102 accelerates past second threshold vehicle speed 614 and the AC computer device 190 is configured to update the volume level 604 to a second limited volume level 620, for example, a volume level of zero as shown on graph 600. As described above, the AC computer device 190 may also simply deactivate audio output to exterior audio assembly 106 once speed exceeds the first threshold level. In the illustrated embodiment, a first speed range may be defined between the first threshold vehicle speed 622 and the second threshold vehicle speed 614.

Upon nearing point B, the vehicle 102 decelerates as it prepares to come to a stop at point B. As shown, vehicle speed decreases from ten miles per hour to five miles per hour. In one embodiment, the AC computer device 190 is configured to automatically raise the volume output for the exterior audio assembly 106 to the second limited volume level 620 if the speed decreases to between the first threshold speed and the second threshold speed. In this example, once the speed decreases to five miles per hour at point 618, the AC computer device 190 is configured to raise the volume level from zero (and/or reactivate the audio output) to the first limited volume level 612 (i.e., 10% of maximum in this example). Furthermore, once the vehicle 102 decreases to a speed below the first threshold vehicle speed 622, the AC computer device 190 is configured to raise the volume to the volume level when the vehicle 102 was most recently at a speed below the first threshold vehicle speed 622 (e.g., when the vehicle 102 was back at point A). Accordingly, the AC computer device 190 raises the volume level back to 50% to enable the vehicle owner to hear audio via the exterior audio assembly 106 at the same level as at point A. In other embodiments, once the volume level is zero (i.e., once the speed exceeds the second threshold speed) the AC computer device 190 is configured to leave the volume level for the exterior audio assembly 106 at zero (or deactivated) even if the speed falls below the first threshold speed later on, until the vehicle operator manually raises the volume level from the interior of the vehicle. In still other embodiments, the AC computer device 190 is configured to update the volume level for the exterior audio assembly 106 to be the limited volume level once the speed falls below the first threshold level or even falls to zero, until the vehicle operator manually raises the volume level from the interior of the vehicle.

In one embodiment, the AC computer device 190 is configured to perform a computer-based method for controlling a volume level for a vehicle audio system 100. The vehicle audio system 100 is associated with a vehicle and in communication with an exterior audio assembly 106. The method includes storing, in the memory device 195, at least one limited volume level and a corresponding speed range. The method also includes receiving a speed-related parameter indicative of an actual speed of the vehicle 102 from a vehicle control system. The method further includes determining if the actual speed of the vehicle 102 is within the stored speed range based on the speed-related parameter. The method also includes permitting operation of the exterior audio assembly 106 at the at least one limited volume level when the actual speed of the vehicle 102 is within the speed range.

The method further includes transmitting a volume control command to the exterior audio assembly 106 based on the comparing, and causing, by the volume control command, the exterior audio assembly 106 to update a current volume setting. The method also includes updating a display associated with the vehicle audio system 100 based, at least in part, on the volume control command. The method further includes permitting operation of the exterior audio assembly 106 at a maximum volume level when the actual speed of the vehicle 102 falls below a lower limit of the speed range, and deactivating operation of the exterior audio assembly 106, when the actual speed of the vehicle 102 exceeds the speed range.

The method also includes continuously receiving the speed-related parameter from the vehicle control system. In the example embodiment, the speed-related parameter includes at least one of a current vehicle gear value and a current vehicle speed. The method further includes determining if the current vehicle gear value is a second gear or a third gear. The method also includes determining if the current vehicle speed is between zero and five miles per hour. In the example embodiment, the limited volume level is a predefined percentage of a maximum volume level of the vehicle audio system 100.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112, paragraph (f), unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

The foregoing description of embodiments and examples has been presented for purposes of illustration and description. It is not intended to be exhaustive or limiting to the forms described. Numerous modifications are possible in light of the above teachings. Some of those modifications have been discussed and other will be understood by those skilled in the art. The embodiments were chosen and described for illustration of various embodiments. The scope is, of course, not limited to the examples or embodiments set forth herein, but can be employed in any number of applications and equivalent devices by those of ordinary skill in the art. Rather it is hereby intended the scope be defined by the claims appended hereto. Additionally, the features of various implementing embodiments may be combined to form further embodiments.

What is claimed is:

1. An audio system for a vehicle comprising an audio control computer device and an exterior audio assembly, said audio control computer device in communication with a memory device, said audio control computer device configured to:
store, in the memory device, at least one limited volume level and a corresponding speed range;
receive a speed-related parameter indicative of an actual speed of the vehicle from a vehicle control system;
determine if the actual speed of the vehicle is within the stored speed range based on the speed-related parameter;
permit operation of the exterior audio assembly at the at least one limited volume level when the actual speed of the vehicle is within the speed range;
permit operation of the exterior audio assembly at a maximum volume level when the actual speed of the vehicle falls below a lower limit of the speed range; and
automatically deactivate operation of the exterior audio assembly when the actual speed of the vehicle exceeds the speed range.

2. The audio system of claim 1, wherein said audio control computer device is further configured to:
transmit a volume control command to the exterior audio assembly based on the determining; and
cause, by the volume control command, the exterior audio assembly to update a current volume setting.

3. The audio system of claim 2, wherein said audio control computer device is further configured to update a display associated with the vehicle audio system based, at least in part, on the volume control command.

4. The audio system of claim 1, further comprising:
a vehicle panel comprising an inner surface and an outer surface, said outer surface defining an exterior surface of the vehicle; and
a transducer mounted to said vehicle panel, said transducer configured to be connected to and operated by an amplifier, said transducer comprising a base mounted to said vehicle panel, said transducer causing the vehicle panel to vibrate and create an audio output externally to the vehicle.

5. The audio system of claim 1, wherein said audio control computer device is further configured to continuously receive the speed-related parameter from the vehicle control system.

6. The audio system of claim 1, wherein the speed-related parameter includes at least one of a current vehicle gear value and a current vehicle speed.

7. The audio system of claim 6, wherein to determine if the actual speed of the vehicle is within the stored speed range, said audio control computer device is configured to determine if the current vehicle gear value is a second gear or a third gear.

8. The audio system of claim 6, wherein to determine if the actual speed of the vehicle is within the stored speed range, said audio control computer device is configured to determine if the current vehicle speed is between zero and five miles per hour.

9. The audio system of claim 1, wherein the at least one limited volume level is a predefined percentage of the maximum volume level of the vehicle audio system.

10. A vehicle comprising an exterior audio assembly, a vehicle audio system, and a controller area network (CAN) bus, wherein the vehicle audio system includes an audio control computer device, and wherein said audio control computer device is configured to:
store, in a memory device, at least one limited volume level and a corresponding speed range;
receive a speed-related parameter indicative of an actual speed of the vehicle from a vehicle control system;
determine if the actual speed of the vehicle is within the stored speed range based on the speed-related parameter;
permit operation of the exterior audio assembly at the at least one limited volume level when the actual speed of the vehicle is within the speed range;
permit operation of the exterior audio assembly at a maximum volume level when the actual speed of the vehicle falls below a lower limit of the speed range; and
automatically deactivate operation of the exterior audio assembly when the actual speed of the vehicle exceeds the speed range.

11. The vehicle of claim 10, wherein said audio control computer device is further configured to:
transmit a volume control command to the exterior audio assembly based on the determining; and
cause, by the volume control command, the exterior audio assembly to update a current volume setting.

12. The vehicle of claim 11, wherein said audio control computer device is further configured to update a display associated with the vehicle audio system based, at least in part, on the volume control command.

13. The vehicle of claim 10, further comprising:
a vehicle panel having an inner surface and an outer surface, the outer surface defining an exterior surface of the vehicle; and
a transducer mounted to said vehicle panel, said transducer configured to be connected to and operated by an amplifier, said transducer comprising a base mounted to said vehicle panel, said transducer causing the vehicle panel to vibrate and create an audio output externally to the vehicle.

14. The vehicle of claim 10, wherein the speed-related parameter includes at least one of a current vehicle gear value and a current vehicle speed.

15. The vehicle of claim 14, wherein to determine if the actual speed of the vehicle is within the stored speed range, said audio control computer device is configured to determine if the current vehicle gear value is a second gear or a third gear.

16. The vehicle of claim 14, wherein to determine if the actual speed of the vehicle is within the stored speed range, said audio control computer device is configured to determine if the current vehicle speed is between zero and five miles per hour.

17. The vehicle of claim 10, wherein the at least one limited volume level is a predefined percentage of a maximum volume level of the vehicle audio system.

18. A computer-based method for controlling a volume level for a vehicle audio system associated with a vehicle and in communication with an exterior audio assembly, the vehicle audio system including an audio control computer device, the audio control computer device in communication with a memory device, the method comprising:
storing, in the memory device, at least one limited volume level and a corresponding speed range;
receiving a speed-related parameter indicative of an actual speed of the vehicle from a vehicle control system;
determining if the actual speed of the vehicle is within the stored speed range based on the speed-related parameter;

permitting operation of the exterior audio assembly at the at least one limited volume level when the actual speed of the vehicle is within the speed range;

permitting operation of the exterior audio assembly at a maximum volume level when the actual speed of the vehicle falls below a lower limit of the speed range; and automatically deactivating operation of the exterior audio assembly when the actual speed of the vehicle exceeds the speed range.

\* \* \* \* \*